United States Patent [19]

Nishiki

[11] Patent Number: 4,639,698
[45] Date of Patent: Jan. 27, 1987

[54] CERAMIC ELECTRONIC FILTER

[75] Inventor: Masahiro Nishiki, Aichi, Japan

[73] Assignee: NGK Spark Plug Co., Ltd., Nagoya, Japan

[21] Appl. No.: 820,094

[22] Filed: Jan. 21, 1986

[30] Foreign Application Priority Data

Jan. 21, 1985 [JP]   Japan ................................ 60-6966[U]

[51] Int. Cl.⁴ .................. H03H 9/10; H03H 9/60; H03H 9/52
[52] U.S. Cl. .................................... 333/187; 310/348; 310/352; 333/189
[58] Field of Search ............... 333/186, 187, 188, 189; 310/340–342, 348, 351–352, 354

[56]        References Cited
U.S. PATENT DOCUMENTS

| 2,155,035 | 4/1939 | Bieling ............................ 310/352 X |
| 2,542,045 | 2/1951 | Minnich .......................... 310/342 X |
| 4,353,045 | 10/1982 | Matsui et al. ....................... 333/189 |
| 4,398,162 | 8/1983 | Nagai ................................. 333/189 |

Primary Examiner—Marvin L. Nussbaum
Attorney, Agent, or Firm—Finnegan, Henderson, Farabow, Garrett & Dunner

[57]        ABSTRACT

A ceramic filter with planar, piezoelectric-type resonators and planar inputting, outputting, and grounding terminal boards arranged in parallel relationship in an insulating case with respective edges extending toward an open case side. Terminal legs extending from the respective edges are received in appropriately positioned and configured holes in an insulating lid which closes the case. Outer surface of the lid includes metalized areas for electrically connecting to the terminal legs and for connecting to an external circuit board.

15 Claims, 4 Drawing Figures

CERAMIC ELECTRONIC FILTER

BACKGROUND OF THE INVENTION

1. Field of the Invention

This invention relates to an electronic ceramic filter which can be readily connected to a filter circuit formed on an external printed circuit board.

2. Description of the Prior Art

A conventional ceramic filter is formed by incorporating one or more piezoelectric-type "resonators" with terminal boards used for inputting, outputting and grounding, the resonators and terminal boards all being contained in an insulating case. The terminal boards usually are provided with terminal legs which extend through an insulating layer in the case, and are used to interconnect to external filter circuit elements. The layer typically is made of epoxy resin or the like and functions to seal the opening of the insulating case.

The terminal legs of the inputting, outputting and grounding terminal boards typically are connected to an external printed circuit board by soldering or brazing. In the case of a ladder-type ceramic filter, two kinds of resonators, i.e., relatively thick resonators and relatively thin resonators are employed according to the required electrostatic capacity. It is difficult to uniformly position the terminal boards in the insulating case in conventional ceramic filters, and therefore it is difficult to automate the manufacture. Accordingly, the elongated terminal legs of the terminal boards must be manually connected to the printed cirucit board. This work requires skilled persons and excessive time and expense.

SUMMARY OF THE INVENTION

The above-described problems have been solved by the provision of a ceramic filter in which, according to the present invention, the terminal legs of the inputting, outputting and grounding terminal boards are reduced in length to the extent that they protrude only slightly from the opening of the insulating case. Small holes are formed at predetermined locations in an insulating case lid which closes the opening of the insulating case, for receiving corresponding ones of the reduced-in-length terminal legs. Metalized surfaces of appropriate configurations are provided on the outer surface of the insulating lid, and the terminal legs thus received are electrically connected to metalized surfaces. The received terminal legs of the terminal boards can be easily and automatically connected through the metalized surfaces on the outer surface of the insulating lid to the balance of the filter circuit formed on the external printed circuit board.

BRIEF DESCRIPTION OF THE DRAWING

FIGS. 1A through 1C show a ceramic filter made according to this invention, wherein;

FIG. 1A is a longitudinal sectional view of the ceramic filter;

FIG. 1B is a sectional view taken along line B—B in FIG. 1A; and

FIG. 1C is a bottom view of the ceramic filter.

Description of the Preferred Embodiment

Figure 1A:
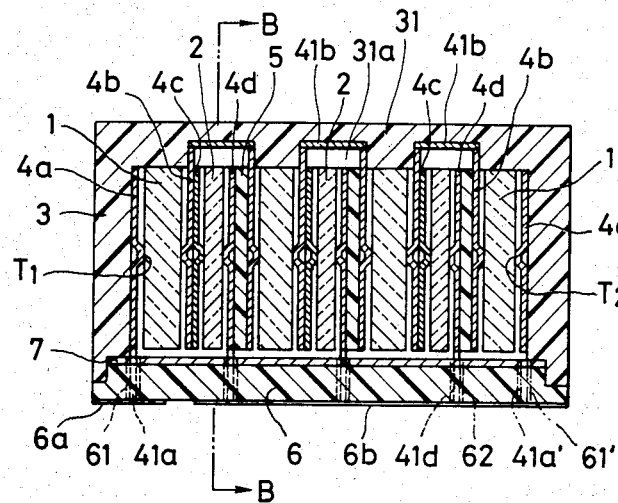
Figure 1B:
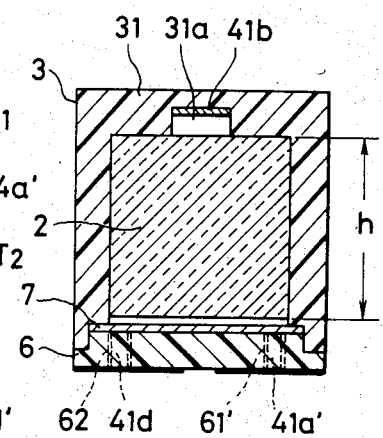
Figure 1C:
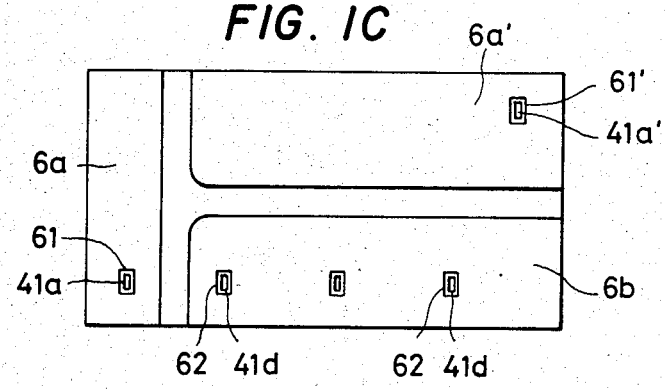

The accompanying drawings show one example of a ceramic filter according to this invention which is a ladder-type filter circuit comprising four series-connected piezoelectric-type resonators and three parallel-connected resonators. In FIG. 1, reference numeral 1 designates thick small-capacity resonators; and 2, thin large-capacity resonators. Each resonator 1 is made of a lead titanate compound or lead zirconate, and metalized electrode surfaces are formed on both major surfaces thereof by silver soldering or the like. The resonators 2 are also formed in the same manner.

As can be seen in FIG. 1, resonators 1 and 2 have essentially the same height "h" and are mounted in alternating parallel relation in insulating case 3 with their respective upper edges abutting case upper wall 31. The bottom of insulating case 3 can be closed by insulating lid 6.

Figure 2:
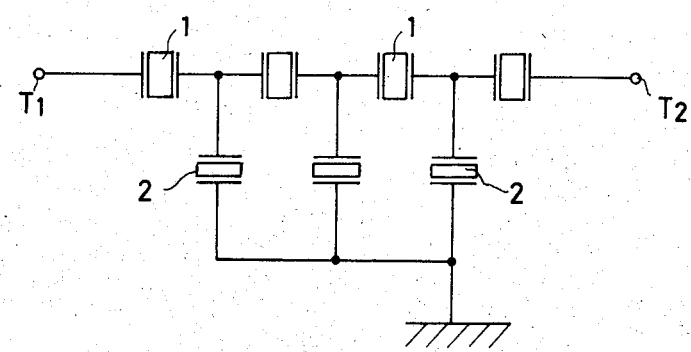
FIG. 2 is an equivalent circuit using the ceramic filter shown in FIGS. 1A through 1C.

Further in FIG. 1, reference characters 4a through 4d and reference character 5 designate terminal boards and insulating separators, respectively, which are used to connect the two kinds of resonators as shown in FIG. 2. More specifically, reference character 4a designates an input terminal board connected to the input terminal T1 of the series-connected thick small-capacity resonators 1, and reference character 4a' designates an output terminal board connected to the output terminal T2 of the series-connected thick small capacity resonators 1. Reference numeral 4b designates series terminal boards having thin U-shaped bridging connecting parts 41b which are inserted into recesses 31a which are formed in the upper wall 31 of the insulating case 3. The series terminal boards 4b are adapted to series-connect the thin large-capacity resonators 2, and the thick small-capacity resonators 1 through the insulating separators 5 which are adjacent to the resonators 2. Reference character 4c designates parallel terminal boards which are used to connect the thin large-capacity resonators 2 in parallel with the thick small-capacity resonators 1 through the series terminal boards 4b, respectively. Reference character 4d designates grounding terminal boards adapted to ground the other electrode surfaces of the thin large-capacity resonators 2.

As can be appreciated from FIG. 1, these terminal boards are arranged to electrically and mechanically engage the respective resonators. Each of the terminal boards has a small protrusion which is used to hold the respective resonator at the node of vibration which is located at the center of the major surface thereof. Also, the terminal boards all have approximately the same height "h" as the resonators and also are positioned by respective edges abutting case upper wall 31.

Of these terminal boards, the input and output terminal boards 4a and 4a' and the grounding terminal boards 4d have terminal legs 41a and 41a', and 41d, respectively, all positioned on the board edge opposite that abutting case wall 31. Each of the terminal legs thus can be made relatively short, protruding from the open bottom of the case a distance about equal to the position of the outer surface of insulating lid 6 when installed.

Further in FIG. 1, insulating lid 6 sealingly covers the open bottom of the insulating case 3 through a sealing board 7, which is also an insulating board inserted when required. The insulating lid is bonded to the open bottom which adhesive (not shown) if necessary. The insulating lid 6 has small holes 61, 61' and 62 appropriately positioned and configured into which the terminal legs 41a and 41a' of the input and output terminal boards and the terminal legs 41d of the grounding terminal boards are received in such a manner that the terminal legs appear just outside the outer surface lid 6. Metalized surfaces 6a, 6a' and 6b of predetermined geometrical configurations are formed around the small holes 61, 61' and 62 into which the terminal legs 41a, 41a' and 41d are inserted. The metalized surfaces are electrically connected to the terminal legs 41a, 41a' and 41d by an electrically conducting method such as for instance brazing which also preferably forms a mechanical seal (not shown). The resultant assembly can be electrically connected to the balance of the filter circuit and also mechanically connected to the latter, for instance, by brazing when the assembly is intended to be mounted on an external printed circuit board.

In the above-described embodiment, the ladder-type filter circuit is formed by using four series-connected resonators 1 and three parallel-connected resonators 2. However, it should be noted that the invention is not limited thereto or thereby. For instance, an L-type filter circuit or a $\pi$-type filter circuit can be formed according to the technical concept of the present invention. Depending on the filter circuit to be formed, the numbers of resonators 1 and 2 and the number of terminal boards 4 can be increased or decreased, and the insulating separators 5 can be eliminated.

In the above-described embodiment, each of the series terminal boards 4b adapted to series-connect the thick small-capacity resonators 1 has the connecting part 41b which is bent U-shaped so as to extend over the alternately positioned resonator 2 and insulating separator 5, and the recess 31a is formed in the upper wall 31 of the insulating case 3 to receive the bent connecting part 41b. However, instead of the bent connecting part 41b, a thin metal wire may be used. Furthermore in the above-described embodiment, each of the terminal legs 41a and 41d and the terminal leg 41a' extends from the portion of the lid-facing edge of the respective terminal board proximate a corner. However, since the three kinds of terminal legs are insulated from one another by lid 6 and are electrically connected to the metalized surfaces 6a, 6a' and 6b, respectively, the positions from which the terminal legs are extended are optional. In addition, for the same reason, the configuration of the metalized surfaces 6a, 6a' and 6b can be optionally determined.

As is apparent from the above-description, in the ceramic filter according to the present invention, the terminal legs of the input terminal board, the output terminal board and the grounding terminal board are received into the small holes formed in the insulating lid which closes the opening of the insulating case, and are electrically connected to the metalized surfaces formed on the outer lid surface around the small holes. Therefore, the ceramic filter can be easily and automatically connected to the external printed cirucit board through the flat and wide metalized surfaces which are formed on the outer surface of the insulating lid. Accordingly, the ceramic filter of the present invention, unlike the conventional ceramic filters with thin and bendable protruding terminal legs, can be readily and positively mounted on the printed circuit board. Furthermore, since the ceramic filter is in the form of a box, it can be mechanically connected to the printed circuit board.

What is claimed is:

1. A filter assembly comprising:
   at least two planar piezoelectric resonator elements, each element having opposed nodal points in the planar surfaces thereof;
   inputting, outputting, and grounding planar terminal boards operatively, electrically and mechanically connected to said resonator elements at said nodal points, said planar resonator elements and said planar terminal boards being positioned in parallel relationship to one another;
   a plurality of terminal legs, one of said legs extending from an edge of each of said planar terminal boards in a direction essentially parallel to the plane of the respective board;
   an insulating case open on one side, said resonator elements and said terminal boards being housed in said case, said terminal boards being positioned in said case with each of said terminal legs protruding from the open case side;
   an insulating lid for closing said case, said lid having holes positioned and configured for receiving said protruding terminal legs; and
   conductive means disposed in a predetermined pattern on the outer surface of said insulating lid for electrically connecting said received terminal legs, wherein said at least two resonator elements are electrically connected in series, the filter assembly further including at least two series terminal boards housed in said insulating case and a bridge element for electrically interconnecting said two resonator elements, and wherein a wall of said insulating case has a recess to receive said bridge element.

2. The filter assembly as in claim 1 wherein said conductive means are metalized areas of the insulating lid outer surface.

3. The filter assembly as in claim 1 wherein said resonator elements and said terminal boards are oriented in said insulating case to be perpendicular to said insulating lid.

4. The filter assembly as in claim 3 wherein said resonator elements and said terminal boards are positioned in said insulating case by abutting contact between respective resonator element and terminal board edges, and the wall of said case opposite the open side.

5. The filter assembly as in claim 1 wherein said insulating case and said insulating lid form a rectangular box-type structure for mounting on circuit boards.

6. The filter assembly as in claim 5 wherein each of said planar terminal boards has essentially the same height defined as the distance between the edge proximate said insulating lid when housed and the respective opposite edge, and wherein each of said respective terminal legs is essentially of the same length.

7. The filter assembly as in claim 1 further including one or more insulating separators positioned parallel to said resonator elements.

8. A filter assembly comprising:
   at least one planar piezoelectric resonator element having opposed nodal points in the planar surfaces thereof;
   inputting, outputting, and grounding planar terminal boards operatively, electrically and mechanically connected to said resonator element at said nodal points, said planar resonator element and said planar terminal boards being positioned in parallel relationship to one another;
   a plurality of terminal legs, one of said legs extending from an edge of each of said planar terminal boards in a direction essentially parallel to the plane of the respective board;

an insulating case open on one side, said resonator element and said terminal boards being housed in said case, said terminal boards being positioned in said case with each of said terminal legs protruding from the open case side;

an insulating lid for closing said case, said lid having holes positioned and configured for receiving said protruding terminal legs;

conductive means disposed in a predetermined pattern on the outer surface of said insulating lid for electrically connecting the said received terminal legs, and a sealing board for separating said insulating lid from said resonator element and said terminal boards, said sealing board having a plurality of apertures therethrough, said terminal legs also protruding through said apertures in said sealing board.

9. The filter assembly as in claim 8 wherein said conductive means are metalized areas of the insulating lid outer surface.

10. The filter assembly as in claim 8 wherein said resonator element and said terminal boards are oriented in said insulating case to be perpendicular to said insulating lid.

11. The filter assembly as in claim 10 wherein said resonator element and said terminal boards are positioned in said insulating case by abutting contact between respective resonator element and terminal board edges and the wall of said case opposite the open side.

12. The filter assembly as in claim 8 wherein said insulating case and said insulating lid form a rectangular box-type structure for mounting on circuit boards.

13. The filter assembly as in claim 12 wherein each of said planar terminal boards has essentially the same height defined as the distance between the edge proximate said insulating lid when housed and the respective opposite edge, and wherein each of said respective terminal legs is essentially of the same length.

14. The filter assembly as in claim 8 further including one or more insulating separators positioned parallel to said resonator element.

15. A filter assembly comprising:

at least two planar piezoelectric resonator elements, each element having opposed nodal points in the planar surfaces thereof;

inputting, outputting, and grounding planar terminal boards operatively electrically and mechanically connected to said resonator elements at said nodal points, said planar resonator elements and said planar terminal boards being positioned in parallel relationship to one another;

a plurality of terminal legs, one of said legs extending from an edge of each of said planar terminal boards in a direction essentially parallel to the plane of the respective board;

an insulating case open on one side, said resonator elements and said terminal boards being housed in said case, said terminal boards being positioned in said case with each of said terminal legs protruding from the open case side;

an insulating lid for closing said case, said lid having holes positioned and configured for receiving said protruding terminal legs;

conductive means disposed in a predetermined pattern on the outer surface of said insulating lid for electrically connecting the said received terminal legs, wherein said at least two resonator elements are electrically connected in series, the filter assembly further including at least two series terminal boards housed in said insulating case and a bridge element for electrically interconnecting said two resonator elements, and wherein a wall of said insulating case has a recess to receive said bridge element, and a sealing board for separating said insulating lid from said resonator elements and said terminal boards, said sealing board having a plurality of apertures therethrough, said terminal legs also protruding through said apertures in said sealing board.

* * * * *